US007078771B2

(12) United States Patent
Kim

(10) Patent No.: US 7,078,771 B2
(45) Date of Patent: Jul. 18, 2006

(54) SOI STRUCTURE AND METHOD OF PRODUCING SAME

(75) Inventor: Min-Su Kim, Kyonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 66 days.

(21) Appl. No.: 10/666,865

(22) Filed: Sep. 18, 2003

(65) Prior Publication Data

US 2004/0056309 A1  Mar. 25, 2004

Related U.S. Application Data

(62) Division of application No. 10/096,185, filed on Mar. 11, 2002, now Pat. No. 6,656,806.

(30) Foreign Application Priority Data

Jul. 31, 2001  (KR)  ................ 2001-46191

(51) Int. Cl.
*H01L 27/11* (2006.01)
(52) U.S. Cl. ................ 257/351; 257/E27.112
(58) Field of Classification Search ................ 257/211, 257/347, 349, 350, 351; 438/149, 151, 154
See application file for complete search history.

(56) References Cited

U.S. PATENT DOCUMENTS

| 5,026,666 | A | * | 6/1991 | Hills et al. ................ 438/301 |
| 5,767,549 | A | * | 6/1998 | Chen et al. ................ 257/347 |
| 6,215,155 | B1 | * | 4/2001 | Wollesen ................ 257/351 |
| 6,424,011 | B1 | * | 7/2002 | Assaderaghi et al. ....... 257/350 |
| 6,426,558 | B1 | * | 7/2002 | Chapple-Sokol et al. ... 257/758 |
| 6,455,894 | B1 | * | 9/2002 | Matsumoto et al. ........ 257/347 |
| 6,627,952 | B1 | * | 9/2003 | Wollesen ................ 257/347 |
| 2002/0003241 | A1 | * | 1/2002 | Kuriyama et al. .......... 257/200 |
| 2002/0020878 | A1 | * | 2/2002 | Kawanaka ................ 257/351 |

* cited by examiner

*Primary Examiner*—Carl Whitehead, Jr.
*Assistant Examiner*—Jennifer M. Dolan
(74) *Attorney, Agent, or Firm*—Marger Johnson & McCollom, P.C.

(57) ABSTRACT

A Silicon On Insulator (SOI) structure and method of producing an SOI structure that can prevent a short circuit between a Local Inter-Connect (LIC) and a well in the SOI structure is disclosed. The SOI structure includes a BOX layer of insulation material formed on a silicon substrate; an SOI layer formed on the BOX layer; a well formed within a device isolation area of the SOI layer such that its lower surface is in contact with the BOX layer; a field oxide film formed on a surface side within the well; a gate line formed across an active area on the SOI layer and a portion on the field oxide film; an N+ type source/drain area formed within the active area along both sides of the gate line to contact its lower surface with the BOX layer; an insulation layer formed on such resultant structure; and an opening part that is formed within the insulation layer. The opening part can be opened in a Full Trench (FT) structure so that the active area is partially exposed, and can be opened in a Partial Trench (PT) structure on the field oxide film so that an upper part of the gate line of an adjacent transistor is exposed. An LIC fills in the opening part within the insulation layer, and in such construction, the SOI element is designed by an FT-LIC structure where the LIC is contacted with one portion of the active area of an optional transistor, and by a PT-LIC structure where the LIC is contacted with an upper part of the gate line on the field oxide film.

8 Claims, 8 Drawing Sheets

SOI STRUCTURE AND METHOD OF PRODUCING SAME

This application is a divisional of U.S. patent application Ser. No. 10/096,185 filed on Mar. 11, 2002, now U.S. Pat. No. 6,656,806 now pending, which is herein incorporated by reference in its entirety.

TECHNICAL FIELD

The present invention relates to a Silicon On Insulator structure and method of making the structure that is capable of preventing a short between a Local Inter-Connect and a well when forming the Local Inter-Connect on a Silicon on Insulator structure that has a well-type body contact.

BACKGROUND

Recently, new techniques of forming a single-crystal silicon layer on an insulation layer, a process called Silicon On Insulator (SOI), and of integrating unit-devices on the silicon layer have been developed. In fabricating a semiconductor device by such a technique, a junction capacitance in driving the device can be lowered, thus improving the speed compared to a general bulk device.

In designing the SOI element, in general the silicon substrate and the unit device of an upper layer part are completely separated by a field oxide film within an SOI layer and by a insulation layer, such as a Buried Oxide layer (BOX) separating the silicon upper layer part from the lower silicon substrate. Additionally, there is an active area sealed by the BOX layer and the field oxide film is used as a channel area of a transistor.

However, in designing the SOI element as the above, when a flow of electrons increases by driving a transistor, the electrons collide with silicon within a drain area and generate silicon electrons and holes. As its result, a phenomenon is created where holes are concentrated to a body side, which is represented as the active area surrounded by the field oxide film and the BOX layer, by a potential difference. When the holes are concentrated to the body side, and the device is a bulk device, then the holes are discharged through to ground, thus there is no problem. But in a case of the SOI structure, the BOX layer is buried under the body, thus, the holes can not be discharged to the silicon substrate side and are instead successively accumulated, which causes a floating body effect. The floating body effect changes a voltage in the body and causes a characteristic drop of the device performance, such as a generation of data error since the threshold voltage of a transistor falls, or a dynamic characteristic of an SRAM becomes unstable.

At present, therefore, in order to correct the floating body problem, the SOI is being designed as a well-type body contact structure by using a partial trench isolation (PTI) process. The well type body contact structure is formed in the device design by making a well situated between the BOX layer and the field oxide film, the well being in contact with the active area, so that the holes that are concentrated into the body side on the driving transistor can be discharged through the grounded well.

FIGS. 1a and 1b show a conventional PTI-SOI structure having the well type body contact structure. FIG. 1a shows a plan layout view of the structure, and FIG. 1b is a cross-sectional view along the A-B-C portion of FIG. 1a.

With reference to FIGS. 1a and 1b, in the conventional PTI-SOI element, a BOX layer 102 made of insulating material is formed on a silicon substrate 100, and on the BOX layer, a P-type SOI layer is formed. In a device isolation area within the SOI layer, a well 104b, which is grounded, is formed. The well 104b has a lower surface in contact with the BOX layer. Further, on the surface of the well 104b area, a field oxide film 116a is formed, and adjacent to the field oxide film, an active area is formed. A gate line 120 is formed on the field oxide film 116a. The gate line connects along the active area of the SOI layer and a given portion of the field oxide film 116a. Within the active area of the gate line 120, along both sides, an N+ type source/drain area 118 of an LDD structure, whose lower surface is in contact with the BOX layer 102, is formed. Also the structure is designed so that the active area surrounded by the BOX layer 102, the field oxide film 116a and the well 104b can be used as a channel area of a transistor and a source/drain.

In this way, by using the PTI process in designing the SOI element, the floating body problem can be solved by discharging the holes that are concentrated to the body side through the grounded well. But, because an Aluminum (Al) wiring line should be formed along the A-B-C line of FIG. 1a by a structural characteristic, an interconnection delay becomes greater than a gate delay of a transistor, namely, a propagation delay time, by increased resistance that comes by reducing chip size. As its result, even though the transistor is made well enough, there is a problem that the element characteristic can not be heightened over some limitation.

In order to solve such a problem, like the bulk device, the wiring line should be replaced from the existing Al to Copper (Cu) as low resistance material. Copper wiring is made by a damascene process, where a deep contact is formed and an intermediate conductive layer like the Local Inter-Connect (LIC) is used in the wiring formation. This is a different process than that used to make Al wiring lines. The fundamental difference between damascene and standard processing is that the metal lines are not etched, but deposited in "grooves" within the dielectric layer, and then excess metal is removed by Chemical-Mechanical Processing (CMP).

By forming the Cu wiring through the introduction of the LIC, a poly gate and the N+ type source/drain area can be directly connected, to effectively perform a layout disposition and also reduce a gate resistance. There is a big improvement in device performance using these methods.

FIGS. 2a and 2b show a plan layout view and a cross-sectional view, respectively, for a structure having an LIC formed by applying the existing damascene process technique as used to form Cu wiring of the bulk device. In FIGS. 2a and 2b, the basic structure is same as the device shown in FIGS. 1a and 1b, excepting for an additional specific formation of the LIC 128 through the damascene process. Thus, a separate description for the above structure will be omitted.

However, in forming the LIC of the SOI element by the damascene technique used in the existing bulk process as it is, a problem exists in that the LIC 128 can pierce the field oxide film 116a and create a short circuit between the LIC 128 and the well 104b, at the reference locations I, as shown in FIG. 2b.

This phenomenon occurs because the field oxide film 116a is considerably etched together when an insulation layer 122 is etched to form the LIC. Presently, in a case of forming the LIC 128 in a bulk device, it is not a serious problem because the field oxide 116a is formed as a thick insulation layer and still insulates the LIC 128 even if partially etched. But, in the case that the field oxide film 116a is provided as a PTI structure used to form the SOI element by the body contact structure like FIG. 2b, the surface of the well 104b is easily exposed in the etching of the insulation layer 122, since the field oxide film 116a is comparatively thin. As a result, a phenomenon occurs that the LIC 128 becomes short circuited to the well 104b in areas under the field oxide film 116a, which seriously influences and degrades the operation of circuits including this LIC structure.

The present invention addresses this and other limitations of the prior art.

SUMMARY OF THE INVENTION

Embodiments of the present invention provide an SOI structure and a method of producing the SOI structure, in which a short circuit between an LIC and a well caused by applying the LIC to an SOI element having a well type body contact structure can be prevented. In embodiments of the invention, an LIC forming process is changed so that the LIC on an active area includes a Full Trench LIC (FT-LIC) in manufacturing the SOI element, and the rest of an LIC on a field oxide film or a gate line of an adjacent transistor includes a Partial Trench LIC (PT-LIC). To achieve this structure and these methods, the SOI element includes a BOX layer of insulation material formed on a silicon substrate; an SOI layer formed on the BOX layer; a well formed in a lower part of a device isolation area of the SOI layer so that its lower surface is in contact with the BOX layer; a field oxide film formed on a surface side within the well; a gate line formed so as to be connected across an active area provided on the SOI layer and a constant portion provided on the field oxide film, an active area provided on both sides of the gate line in such a shape that its lower surface is in contact with the BOX layer; an insulation layer formed on the resultant structure; an opening part which is formed within the insulation layer, which is opened in a full trench structure so that the active area of an optional transistor is partially exposed, and which is opened in a partial trench structure so that an upper part of the gate line of an adjacent transistor is exposed without exposing a well area of a lower part on the field oxide film; and an LIC filled in the opening part within the insulation layer. In such a construction, the SOI element is designed by an FT-LIC structure such that the LIC is contacted with the active area of the optional transistor and by a PT-LIC structure that the LIC is contacted with an upper part of the gate line on the field oxide film.

Other embodiments of the invention include a method for producing an SOI element by: positioning a BOX layer of insulation material on a silicon substrate to form an SOI layer; accumulating a pad oxide film, a nitride film and a first oxide layer on the SOI layer in sequence; etching the nitride film and the first oxide layer of a device isolation area by using a mask as a pattern for restricting an active area forming part; ion-injecting inductive impurities onto the resultant structure, and forming a well so that its lower surface is in contact with the BOX layer in the device isolation area; forming a spacer on both of side walls of the nitride film and the first oxide layer remaining on the active area; etching the pad oxide film and one portion of the well of the spacer outer side so that the well remains as a constant thickness on the BOX layer; CMP-processing the second oxide layer so that the nitride film remains as a constant thickness on the active area, and forming a field oxide film of second oxide layer material on the surface of the well; eliminating the nitride film, the pad oxide film and the spacer remaining on the active area, and exposing the active area of the SOI layer; forming a gate line so as to be connected across a portion of the field oxide film and the active area; forming a source/drain area where its lower surface is in contact with the BOX layer within the active area along both sides of the gate line; forming an insulation layer on the resultant structure; executing a primary damascene process in which the insulation layer of an LIC forming part is etched to a constant thickness so that the gate line on the field oxide film is partially exposed, and after that, performing a secondary damascene process in which the remaining insulation layer on the active area is etched, and forming an opening part which is opened in a full trench structure on the active area and which is opened in a partial trench structure on the field oxide film; and filling up the opening part with a metal film, CMP-processing it, and forming an LIC.

Presently, the opening part can be formed by a method of executing the primary damascene process in which only the insulation layer on the device isolation area is etched to a constant thickness so that the gate line on the field oxide film is partially exposed, and after that, by performing the secondary damascene process in which the insulation layer is selectively etched by a constant portion so that the active area is exposed. As mentioned above, in manufacturing the SOI element, on the field oxide film the etching of the insulation layer stops at leaving enough of the field oxide film to connect the gate line and the LIC by the primary damascene process, meantime, on the active area the etching of the insulation layer is progressed until the active area is partially exposed by the secondary damascene process, therefore, when etching the insulation layer of a portion where the LIC will be formed, etching the field oxide film can be prevented from being etched in addition thereto.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

FIG. 1A is a plan layout view and FIG. 1B is a cross-sectional view along the A-B-C portion of FIG. 1A.

FIG. 2A is a plan layout view and FIG. 2B is a cross-sectional view along the A-B-C portion of FIG. 2A.

FIG. 3A is a plan layout view and FIG. 3B is a cross-sectional view along the A-B-C portion of FIG. 3A.

DETAILED DESCRIPTION OF PREFERRED EMBODIMENT

Reference will now be made in detail to preferred embodiments of the present invention, examples of which are illustrated in the accompanying drawings.

Figure 3A:
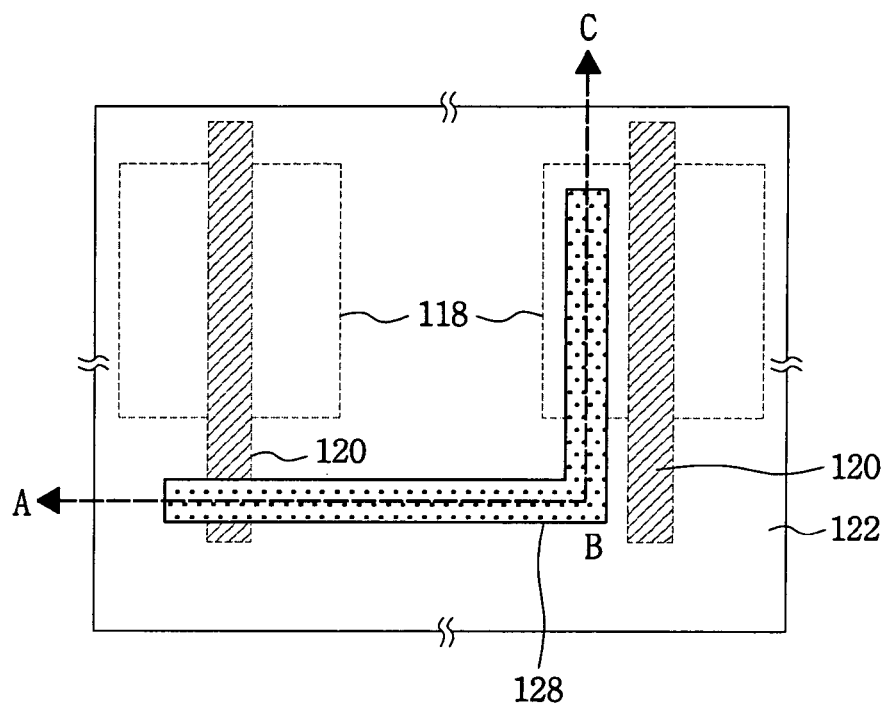
FIGS. 3A and 3B show the structure of an SOI device according to an embodiment of the present invention.
Figure 3B:
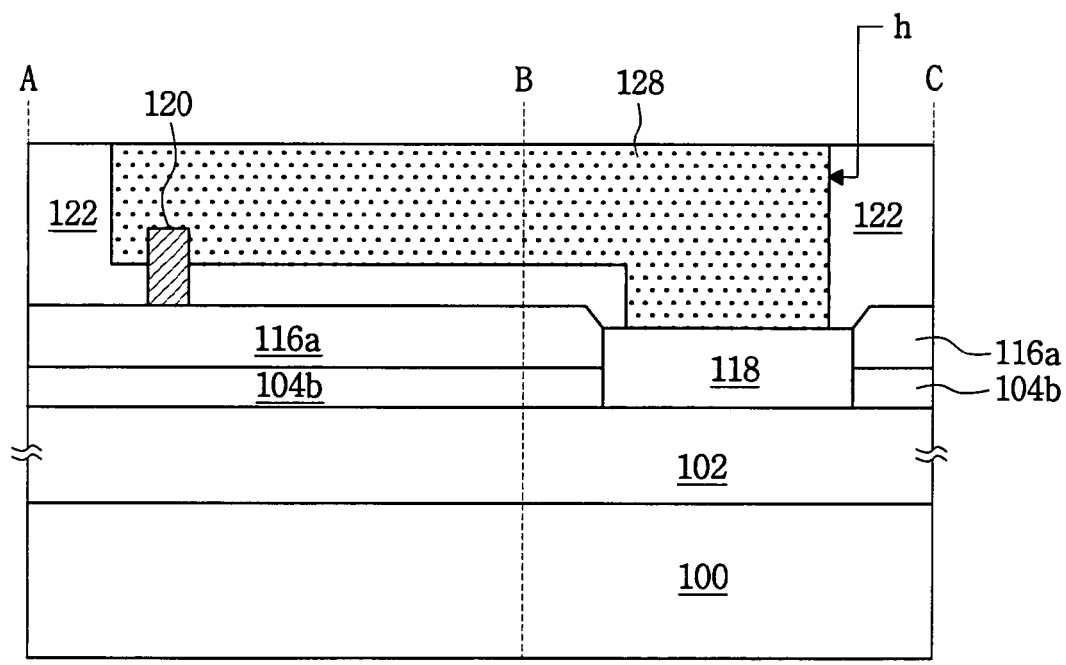

FIGS. 3a and 3b show the structure of a PTI-SOI element that has a well type body contact structure. FIG. 3a shows a plan layout view overlooking the structure, and FIG. 3*b* shows a cross-sectional view along the A-B-C portion of FIG. 3*a*.

In FIGS. 3*a* and 3*b*, a PTI-SOI structure according to an embodiment of the invention has the structure of a BOX layer 102 of insulation material formed on a silicon substrate 100, and a well 104*b* formed over the BOX layer to form an SOI layer, which is grounded. The lower surface of the well 104*b* contacts the BOX layer 102. A field oxide film 116*a* is formed on the surface side of the well 104*b*, and a gate line 120 is formed on the field oxide film. The gate line 120 extends over a portion of the field oxide film 116*a* and over a portion of an active area 118. Within the active area 118, along both sides of the gate line 120, is a structure that has its lower surface in contact with the BOX layer 102. An insulation layer 122 is formed on such the resultant structure, having an opening part h. In a full trench structure (FT), the opening part h is formed in a shape such that it exposes a portion of the active area 118. In a partial trench structure (PT), the opening part h is formed in a shape such that it exposes an upper part of the gate line 120 of an adjacent transistor, and an LIC 128 of conductive material is formed within the opening part h.

Therefore, as shown in FIG. 3*b*, in this case the LIC 128 has an FT-LIC structure having a contact with the active area 118, and has a PT-LIC structure having a contact with the upper part of the gate line 120 on the field oxide film 116*a*.

Methods of manufacturing this and other structures that embody the invention are described as follows, under a classification of several steps, referring to a process order view shown in FIGS. 4*a* through 4*i*.

Figure 4A:
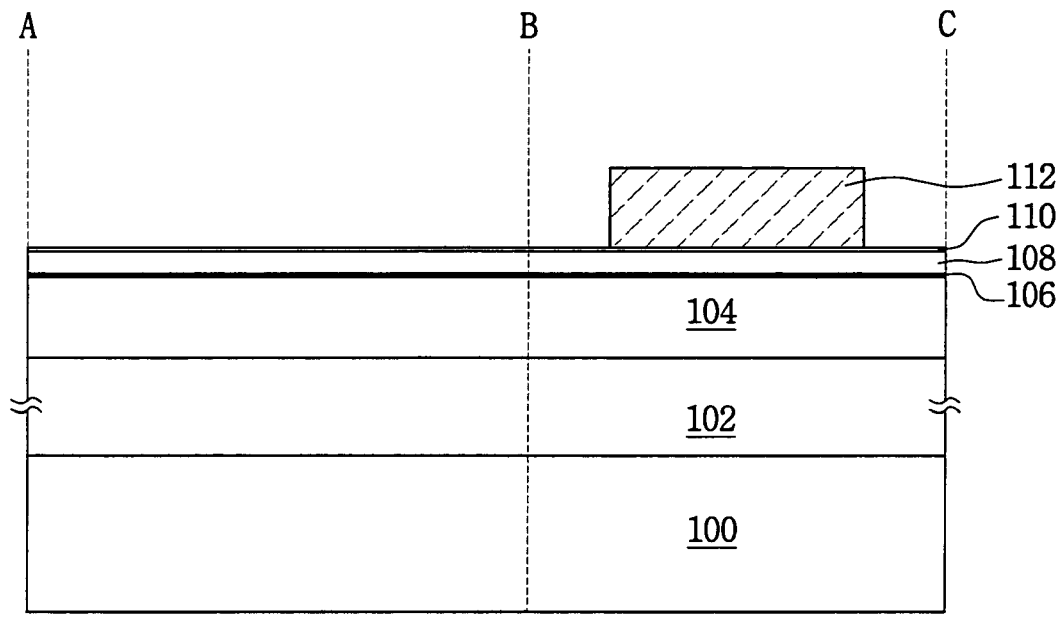
FIGS. 4A through 4I are process order views showing a method of producing the structure shown in FIG. 3B, according to an embodiment of the present invention.

In a first step, as shown in FIG. 4*a* the BOX layer 102 of the insulation material is located on the silicon substrate 100, and the SOI layer 104 is located on the BOX layer. Then, on the SOI layer 104, a pad oxide film 106, a nitride film 108 and a first oxide layer 110 of High-Temperature-deposited-Oxide (HTO) material are sequentially added. The pad oxide film 106 and the first oxide layer 110 may have thicknesses of about 100~120 Å, and the nitride film 108 may have a thickness of about 1800~2200 Å. Subsequently, a resist pattern 112 for defining the active area is formed on the first oxide layer 110.

Figure 4B:
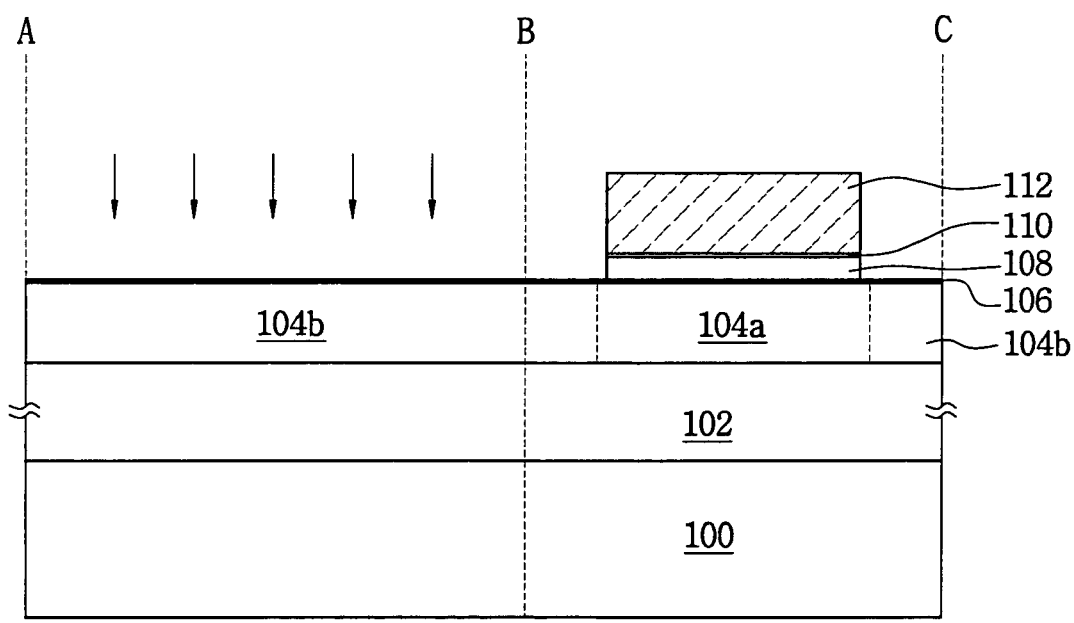

In a second step, as shown in FIG. 4*b*, the nitride film 108 and the first oxide layer 110 of a device isolation area are sequentially etched using the resist pattern 112 as an etching mask. This results in exposing much of the surface of the pad oxide film 106 of the device isolation area. Then, P-type impurities are ion-injected onto the structure to form the well 104*b*, whose lower surface is in contact with the BOX layer 102 in the device isolation area within the SOI layer 104. In FIG. 4B and following, a reference number 104*a* represents an active area portion of the SOI layer 104.

Figure 4C:
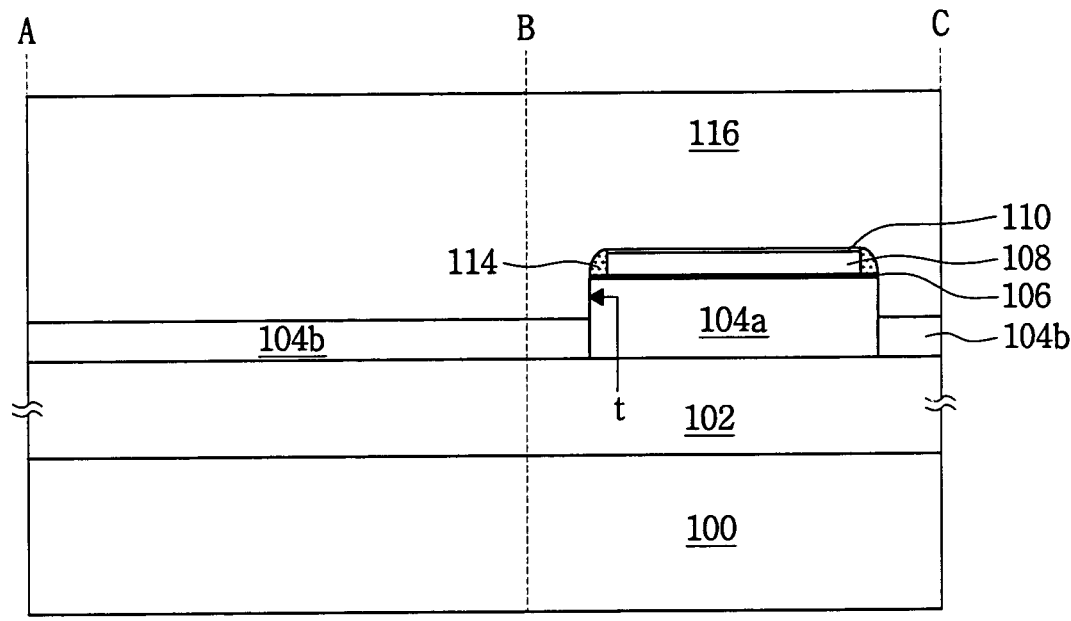

In a third step, as shown in FIG. 4*c*, the resist pattern 112 is removed, and insulation spacers 114 are formed on both side walls of the nitride film 108 and the first oxide layer 110 remaining on the active area 104*a* of the SOI layer. Next, the portion of the pad oxide film 106 that is not covered by the nitride film 108 or the spacers 114 is etched, and then a portion of the thickness of the well 104*b* is etched such that the well 104*b* has a constant thickness on the BOX layer 102 that is thinner than the active area 104*a*, thus forming a trench t where the active area 104*a* meets the well 104*b*. Then, on the resulting structure, a second oxide layer 116 of a "USG/P-TEOS" (Undoped Silica Glass/P-tetra-ethyl-ortho-silicate) type accumulation structure is formed, followed by an annealing process for the sake of film polishing.

Figure 4D:
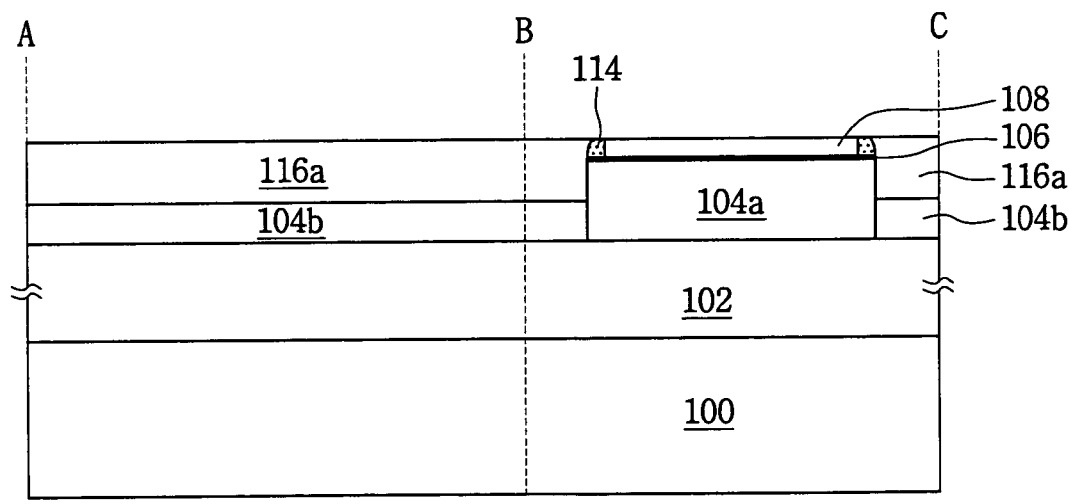

In a fourth step, as shown in FIG. 4*d*, the second oxide layer 116 is Chemical-Mechanical Polished (CMP) processed to a level such that the nitride film 108 has a constant thickness, e.g., 1200~1300 Å, on the pad oxide film 106 to form the field oxide film 116*a* of the second oxide layer material on the well 104*b* surface.

Figure 4E:
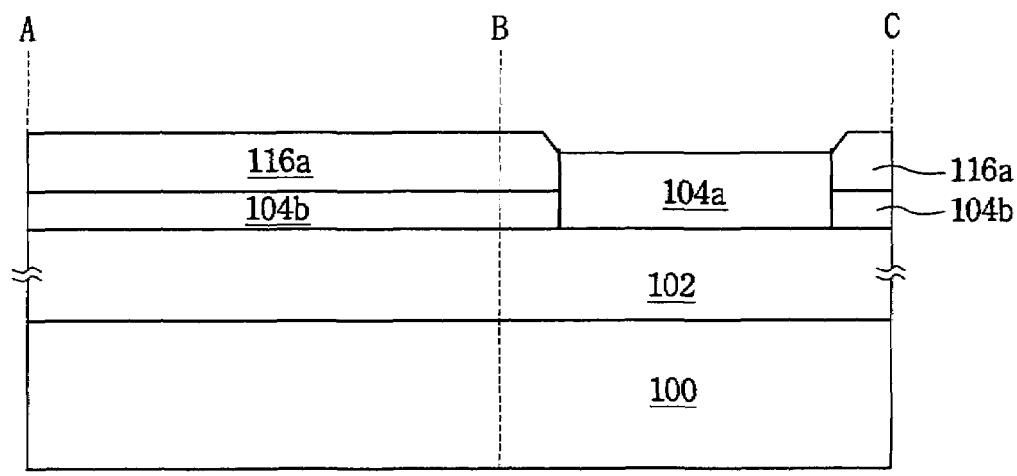

In a fifth step, as shown in FIG. 4*e*, all of the remaining spacer 114, the nitride film 108 and the pad oxide film 106 are removed to expose the active area 104*a*.

Figure 4F:
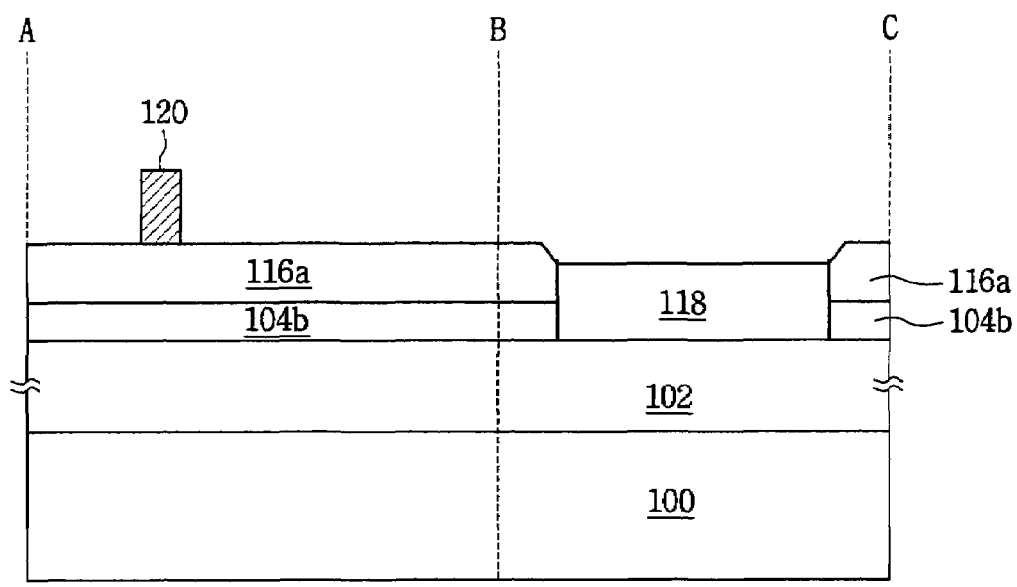

In a sixth step, as shown in FIG. 4*f*, a gate oxide film (not shown) is formed across a portion of the field oxide film 116*a* and the active area 104*a*, to form a portion of the gate line 120. Then, the lower surface of the active area 104*a*, on both sides of the gate line 120, is made to contact with the BOX layer 102. After that step, active area 104*a* is shown as the area 118, as in FIGS. 3A and 3B.

Figure 4G:
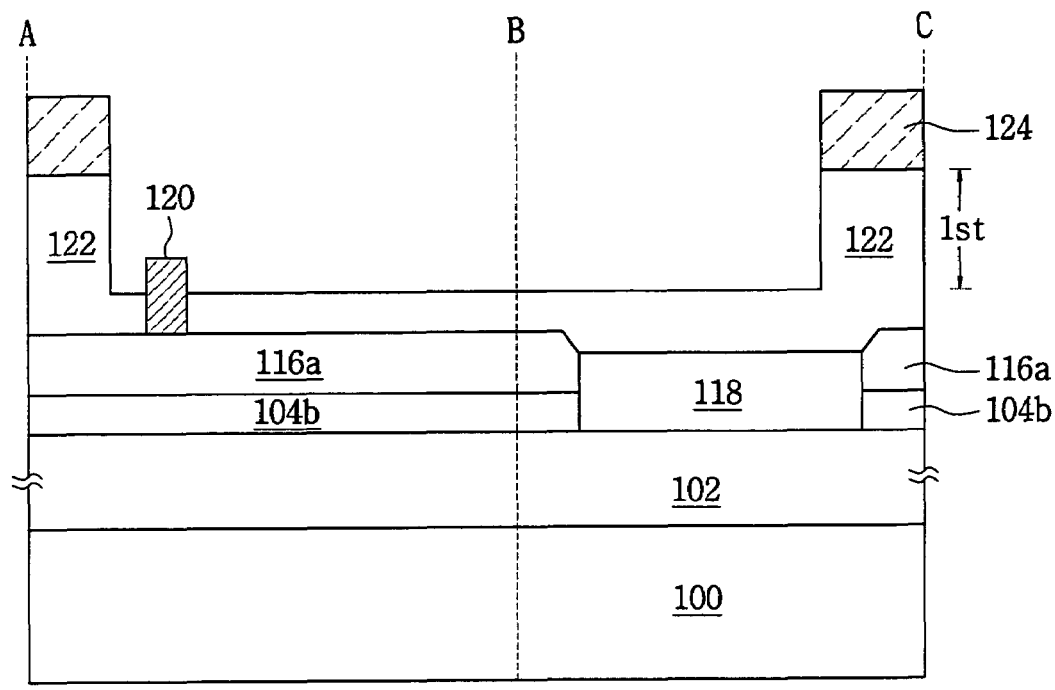

In a seventh step, as shown in FIG. 4*g*, an insulation layer 122, having a thickness of, for example, 10000~12000 Å is formed, and on that, a resist pattern 124 for limiting the size of an LIC is formed. Once the resist pattern 124 is formed, it is used as a mask to etch the insulation layer 122 to a constant thickness so that the gate line 120 is partially exposed. For the sake of convenience, this will be called the first damascene process. In the first damascene process, it is desirable to embody the invention so as to stop the etching of the insulation layer 122 so that about ½ the thickness (t) of the gate line 120 is exposed, which will be used to contact the later formed LIC.

Figure 4H:
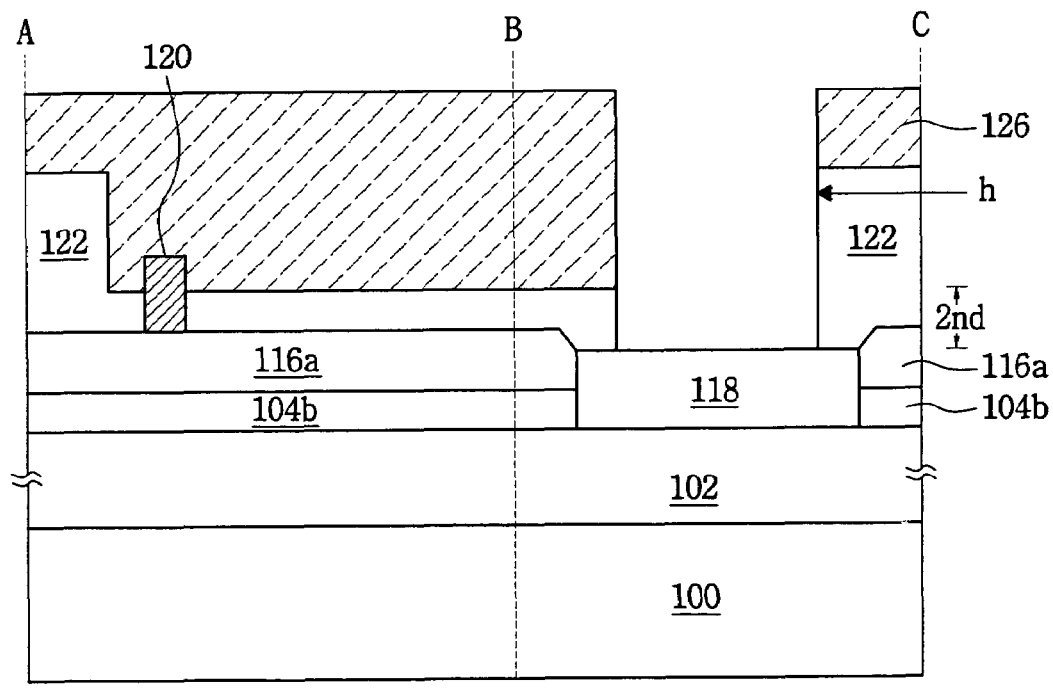

In an eighth step, as shown in FIG. 4*h*, the resist pattern 124 is eliminated, and a resist pattern 126 is formed on the insulation layer 122 so as to open only a portion of where the LIC will be formed among the active area 118. Then, by providing the resist pattern 126 as a mask, the remaining insulation layer 122 on the active area 104 is selectively and partially etched. For the sake of convenience, this is called the second damascene process. The result of this etching forms an opening part h, which is based on a shape that the opening part is opened in the FT structure in which the active area 118 is exposed, and in the PT structure in which an upper portion of the gate line 120 is exposed.

Figure 4I:
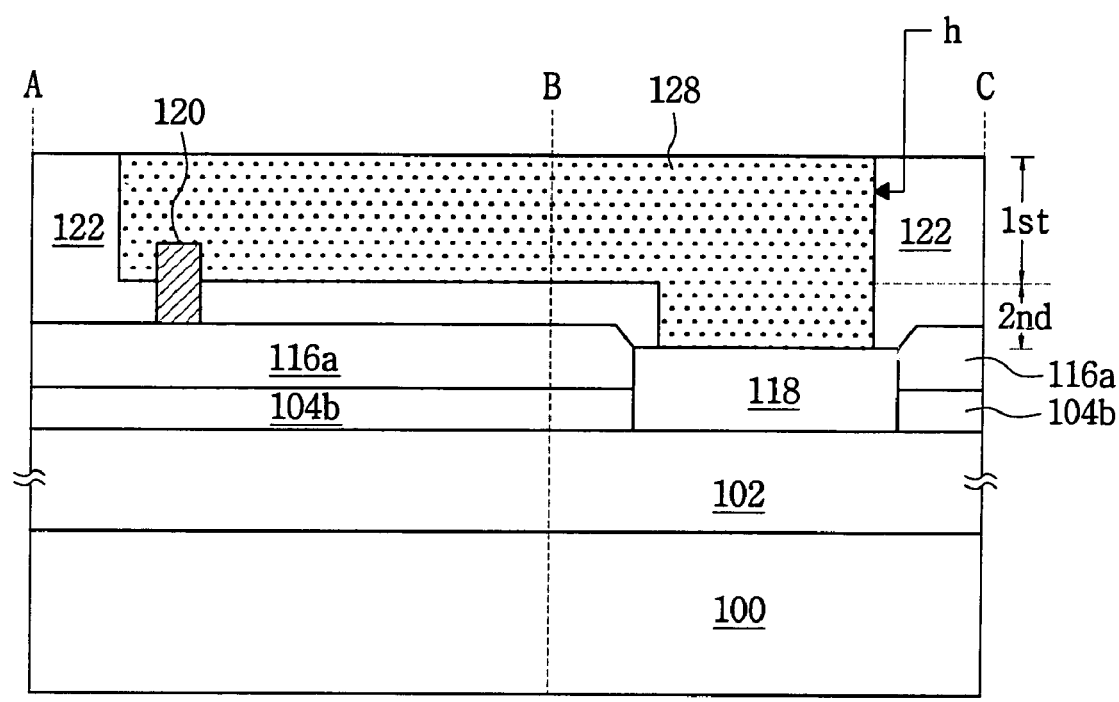

In a ninth step, as shown in FIG. 4*i*, the resist pattern 126 is eliminated, and a metal film of conductive material such as Tungsten (W) or Cu, etc. is formed on the insulation layer 122 so as to sufficiently fill up the inside of the opening part h. After that, the structure is CMP-processed until the surface of the insulation layer 122 is exposed, thereby forming the LIC of the conductive material within the opening part h, and completing the progression of this process.

In its result, the LIC of the above-mentioned shape, namely, the FT-LIC structure contacted with the active area 118 is provided, and on the field oxide film 116*a*, the provided is the LIC 128 of a shape having the PT-LIC structure which has a contact with the upper portion of the gate line 120 of an adjacent transistor.

When the LIC is formed like this, i.e., where the first damascene process is carried out such that the process for an etching depth of the insulation layer 122 stops at a thickness enough to expose a portion of the gate line 120, and that the secondary damascene process is carried out such that only a portion of the insulation layer 122 on the active area 118 is etched, then the field oxide film 116*a* can remain free from being etched when forming the opening part h.

Figure 1A:
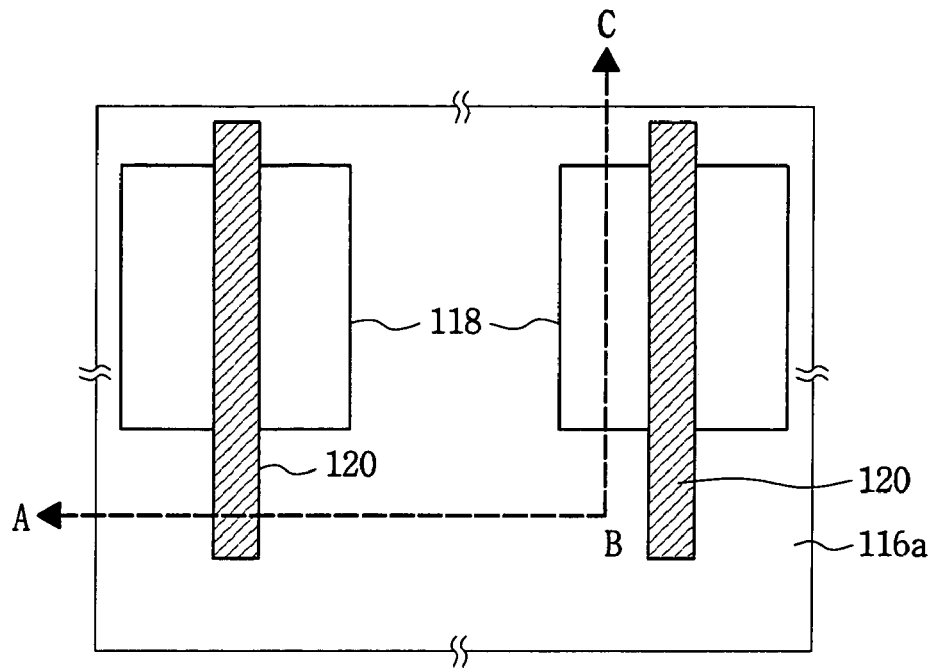
FIGS. 1A and 1B represent the structure of a conventional Partial Trench Isolation-SOI (PTI-SOI) structure.
Figure 1B:
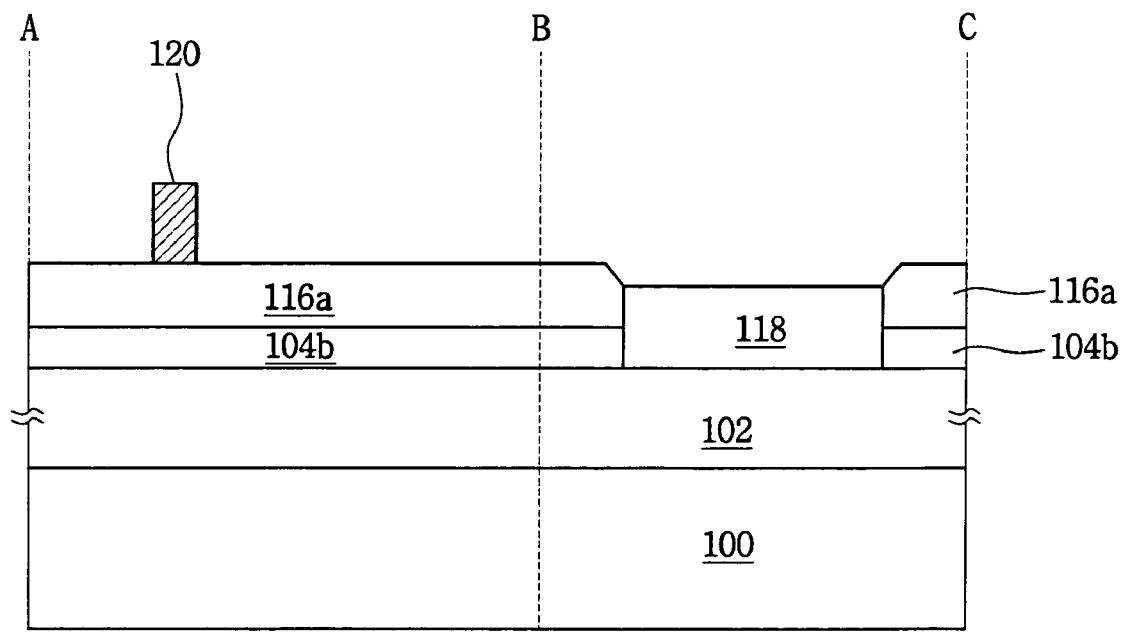
Figure 2A:
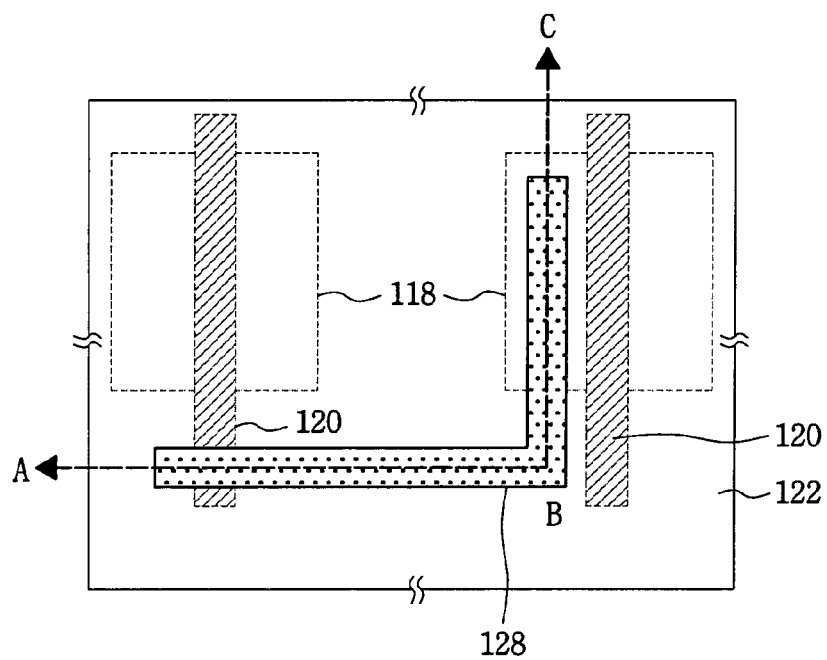
FIGS. 2A and 2B show the structure of FIGS. 1A and 1B after creating an LIC formed using the process for forming Cu wiring in a bulk device.
Figure 2B:
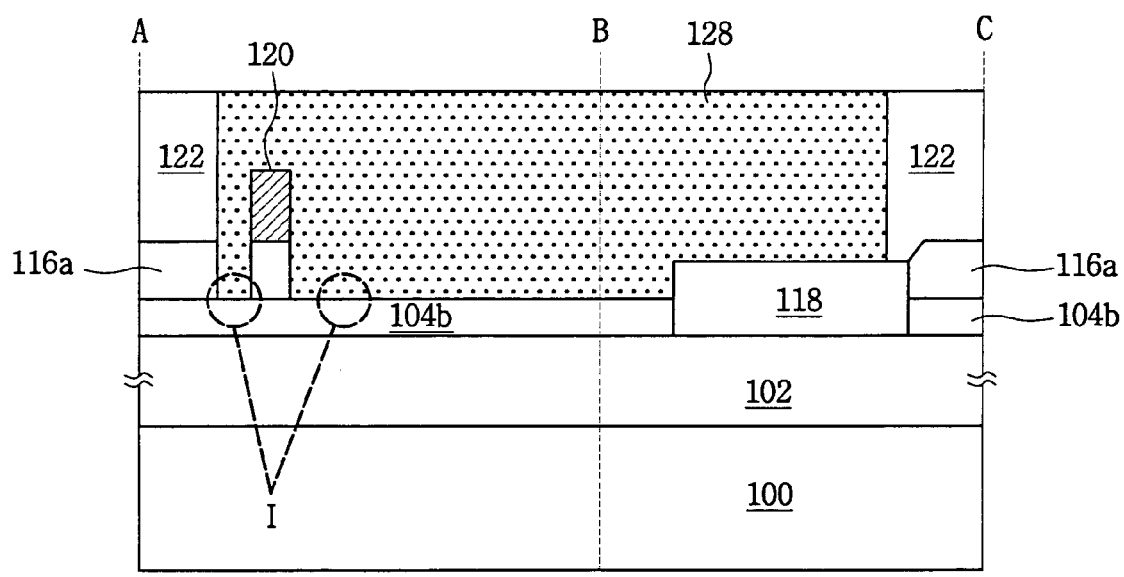

Thus, even though the field oxide film 116*a* is provided in the PTI structure to help form the SOI element in the well type body contact structure, unlike prior art circuits it does not cause a phenomenon like the LIC 128 of FIG. 2B where a short circuit exists with the well 104b provided under the field oxide film 116a.

Additionally, in an alternative embodiment of the present invention, which omits the processes described with reference to FIGS. 4g and 4h, the opening part h can be formed in such a way that only the insulation layer 122 on the device isolation area is first selectively etched to a constant thickness in the primary damascene process so that the gate line 120 is partially exposed, and after that, only the insulation layer 122 on the active area is selectively etched in a portion in the secondary damascene process so that the active area 118 is exposed.

In addition, the present invention can be applied not only to NMOS transistors but also to PMOS transistors.

In this case, on the field oxide film 116a, the etching of the insulation layer 122 is stopped at the thickness enough to expose the gate line 120 to the LIC 128, meanwhile, on the active area 118, the etching of the insulation layer 122 progresses so that one portion of the surface is exposed. Therefore, it can be naturally prevented the field oxide film 116a from being etched together in forming the opening part h.

As discussed above, in accordance with embodiments of the present invention and in manufacturing an SOI element, an LIC can be designed through a change of a process so that an FT-LIC (Full Trench-LIC) structure is provided on an active area, while, a PT-LIC (Partial Trench LIC) structure is provided on the rest of a field oxide film or a gate line. Accordingly, a short between the LIC and the well can be prevented, such as when applying the LIC to the SOI element having a well type body contact.

It will be apparent to those skilled in the art that various controls and variations can be made in the present invention without deviating from the spirit or scope of the invention. Thus, it is intended that the present invention covers and variations embodiments of the invention other than those described, provided they come within the scope of the appended claims and their equivalents.

What is claimed is:

1. A Silicon On Insulator (SOI) structure comprising:
   a silicon substrate;
   a buried oxide (BOX) layer disposed on an upper surface of the silicon substrate;
   a semiconductor layer disposed on an upper surface of the BOX layer, the semiconductor layer including an active area and a device isolation area, the device isolation area of the semiconductor layer consisting of a well having a lower surface in contact with the upper surface of the BOX layer, the well including additional impurity ions compared to the active area;
   a field oxide film disposed on an upper surface of the well;
   a first gate line disposed over a portion of the active area and a portion of the field oxide film, the active area disposed along two sides of the first gate line;
   an insulation layer disposed on an upper surface of the active area and an upper surface of the field oxide film; and
   a Local Inter-Connect (LIC) disposed in contact with the insulation layer, an upper part of a second gate line, and the active area, the LIC including a conductive material.

2. The SOI structure of claim 1, wherein the conductive material comprises Tungsten.

3. The SOI structure of claim 1, wherein the conductive material comprises Copper.

4. A semiconductor structure comprising:
   a substrate;
   an insulating layer disposed on the substrate;
   a semiconductor layer disposed on the insulating layer;
   a well disposed in a lower part of the semiconductor layer;
   a field oxide layer disposed on a surface of the well;
   a first active area and a second active area disposed in the semiconductor layer, the first and second active areas adjacent to the well;
   a gate line disposed across the second active area and across a portion of the field oxide layer;
   an insulation layer disposed on the first active area and disposed on the field oxide layer, the insulation layer in contact with a sidewall of the gate line; and
   a metal fill disposed in contact with the insulation layer, in contact with an upper surface and the sidewall of the gate line, and in contact with an upper surface of the first active area.

5. The semiconductor structure of claim 4 wherein the metal fill comprises Tungsten.

6. The semiconductor structure of claim 4 wherein the metal fill comprises Copper.

7. A semiconductor structure having at least two active regions and a device isolation region, the structure comprising:
   a substrate;
   a buried oxide (BOX) layer disposed in contact with the substrate;
   a semiconductor layer disposed in contact with an upper surface of the BOX layer, the semiconductor layer thicker in the at least two active regions than in the device isolation region, the device isolation region of the semiconductor layer consisting of a well, the well including additional impurity ions compared to the at least two active regions;
   a field oxide film that is disposed in contact with the well and that is horizontally coextensive with the well;
   a first gate line crossing over one of the at least two active regions and in contact with the field oxide film;
   a second gate line crossing over another one of the at least two active regions and in contact with the field oxide film;
   an insulation layer disposed in contact with the field oxide film and disposed in contact with a lower portion of the first gate line; and
   a conductive metal layer disposed in contact with the insulation layer, disposed in contact with an upper surface and a sidewall of the first gate line, and disposed in contact with the another one of the at least two active areas.

8. The semiconductor structure of claim 7, wherein the conductive metal layer comprises a material selected from the group consisting of tungsten and copper.

* * * * *